(12) United States Patent
Engelhardt

(10) Patent No.: US 7,502,723 B1
(45) Date of Patent: Mar. 10, 2009

(54) ASYMMETRIC MINOR HYSTERESIS LOOP MODEL AND CIRCUIT SIMULATOR INCLUDING THE SAME

(75) Inventor: Michael Thomas Engelhardt, Santa Clara, CA (US)

(73) Assignee: Linear Technology Corporation, Milpitas, CA (US)

( * ) Notice: Subject to any disclaimer, the term of this patent is extended or adjusted under 35 U.S.C. 154(b) by 595 days.

(21) Appl. No.: 11/216,008

(22) Filed: Sep. 1, 2005

Related U.S. Application Data

(60) Provisional application No. 60/685,887, filed on Jun. 1, 2005.

(51) Int. Cl.
G06F 7/60 (2006.01)
G06F 17/50 (2006.01)

(52) U.S. Cl. .................. 703/2; 703/13; 703/14
(58) Field of Classification Search .......... 703/2, 703/13, 14
See application file for complete search history.

(56) References Cited

OTHER PUBLICATIONS

"Asymmetric Magnetization Reversal in Exchange-Biased Hysteresis Loops", Fitzsimmons et al. Physical Review Letters, vol. 84, No. 17, Apr. 24, 2000.*

"A Self Consistent Generalized Model for the Calculation of Minor Loop Excursions in the Theory of Hysteresis" Jiles, D.C. IEEE Transactions on Magnetics, vol. 28, No. 5 Sep. 1992.*

Chan et al., "Nonlinear Transformer Model for Circuit Simulation", IEEE Transactions on Computer-Aided Design, vol. 10, No. 4, Apr. 1991.

D.C. Jiles, "Theory of Ferromagnetic Hysteresis," Journal of Magnetism and Magnetic Materials, 1986, pp. 48-60, vol. 61, Elsevier Science Publishers B.V., North-Holland, Amsterdam.

* cited by examiner

*Primary Examiner*—Paul L Rodriguez
*Assistant Examiner*—Nithya Janakiraman
(74) *Attorney, Agent, or Firm*—McDermott Will & Emery LLP

(57) ABSTRACT

The present disclosure relates to simulating inductors wound on a ferromagnetic core as the magnetic material saturates. In one application, the present disclosure is advantageously used to model the asymmetric minor hysteresis loops commonly traversed by the output inductor of a switch mode power supply. An advantage of the subject matter of the disclosure is that it allows practical nonlinear inductors to be modeled in a computationally lightweight manner without conventional non-physical behavior under asymmetric minor hysteresis loop traversals. The disclosure is also conveniently applicable to practical ferromagnetic core materials because, in one particular implementation, the input parameters to the model are the core's coercive force (Hc), remnant magnetization flux density (Br), and saturation flux density (Bs).

9 Claims, 9 Drawing Sheets

NEW METHOD

ASYMMETRIC MINOR HYSTERESIS LOOP MODEL AND CIRCUIT SIMULATOR INCLUDING THE SAME

RELATED APPLICATION

This application claims the benefit under 35 U.S.C. § 119 (e) of U.S. Provisional Patent Application No. 60/685,887 filed on Jun. 1, 2005, entitled "Asymmetric Minor Hysteresis Loop Model and Circuit Simulator Including the Same," which is incorporated by reference herein in its entirety.

TECHNICAL FIELD

The present disclosure relates generally to circuit simulation, and more particularly, to modeling the ferromagnetic core of an inductor or transformer.

BACKGROUND

In one conventional technique for modeling inductors, an accurate model of hysteresis loops can be obtained. See D. C. Jiles and D. L. Atherton, Journal of Magnetism and Magnetic Materials 61 (1988) at 48-60. Although the Jiles-Atherton technique is accurate, there are several disadvantages to the application of it for circuit simulation. This technique uses transcendental math functions that tend to slow simulation speed (i.e., a compute-bound process). Further, the Jiles-Atherton equations are not typically modeled in terms of parameters readily known for ferromagnetics, such as coercive force (Hc), remnant magnetization flux density (Br), and saturation flux density (Bs). Another disadvantage of Jiles-Atherton is that it has been difficult to use their method in the modeling of gapped inductors.

Another conventional approach for modeling inductors is computationally "lightweight" (i.e., no transcendental functions) but parameterized by the parameters typically known for ferromagnetics. See John Chan et al. *Nonlinear Transformer Model for Circuit Simulation*, IEEE Transactions on Computer-Aided Design, vol. 10, no. 4 (April 1991) at 476-482. One problem with the Chan method, however, is that asymmetric minor hysteresis loops can disadvantageously exhibit non-physical properties, such as the minor hysteresis loops extending beyond the bounds of the major hysteresis loop.

FIG. 1 illustrates the offending asymmetrical minor hysteresis loops 105 present in Chan's model. Asymmetric hysteresis loops are of two forms. Using Chan's notation of Bd as the constant of vertical translation between a minor loop branch and the corresponding branch of the major loop, if there is a minor loop with Bd less than Br that can be extended beyond the initial magnetization path to meet the turning point, then that is used for that branch of the asymmetric hysteresis loop. But if there is no such minor loop, then Chan's technique translates the lower major hysteresis loop horizontally and vertically to fit the turning point. This translation results in the offending asymmetrical minor hysteresis loops 105, which exhibit non-physical behavior in that they extend beyond the major hysteresis loop 110. The inductor appears to be saturated when traversing the offending asymmetrical minor hysteresis loops 105 because of the flatness of the slope of these loops. As one skilled in the art will appreciate, circuit simulations or other uses of Chan's model tend to produce erroneous results because the inductor appears to be saturated when it should in fact not be saturated.

What is needed is a computationally lightweight technique for modeling the ferromagnetic core of an inductor or transformer in a circuit simulator that does not exhibit non-physical behavior associated with the asymmetric minor loops. What is further needed is a technique for modeling the ferromagnetic core of an inductor or transformer that uses the typical parameters known for ferromagnetic materials.

SUMMARY

In one aspect, a method of modeling the ferromagnetic core of an inductor or transformer in a circuit simulator includes obtaining upper and lower branch functions for the major hysteresis loop and obtaining an initial magnetization path as an average of the upper and lower branch functions. The method further includes determining symmetric minor hysteresis loops as the upper and lower branch functions vertically translated by a constant for each specific symmetric minor hysteresis loop. Asymmetric minor hysteresis loops are constructed as an extension of a minor symmetric hysteresis loop when such a minor loop exists. If such a minor loop does not exist, then the asymmetric minor hysteresis loop is defined by a function bound between the branch of the minor hysteresis loop containing the turning point and a basis function composed of the initial magnetization path for one sign of H and a branch of the major loop translated by the remnant magnetization flux density for the other sign of H.

In another aspect, a system of modeling the ferromagnetic core of an inductor or transformer in a circuit simulator includes a processor having program code instructions for obtaining upper and lower branch functions for the major hysteresis loop and obtaining an initial magnetization path as an average of the upper and lower branch functions. The processor further includes program code instructions for calculating symmetric minor hysteresis loops as the upper and lower branch functions vertically translated by a constant for each specific symmetric minor hysteresis loop. Asymmetric minor hysteresis loops are constructed as an extension of a minor symmetric hysteresis loop when such a minor loop exists. If such a minor loop does not exist, then the asymmetric minor hysteresis loop is defined by a function bound between the branch of the minor hysteresis loop containing the turning point and a basis function composed of the initial magnetization path for one sign of H and the major loop translated by the remnant magnetization flux density for the other sign of H.

Further features of the invention, its nature and various advantages will be more apparent from the accompanying drawings and the following detailed description.

BRIEF DESCRIPTION OF THE DRAWINGS

The accompanying drawings illustrate several embodiments or implementations and, together with the description, serve to explain the principles of the invention.

DETAILED DESCRIPTION OF THE EMBODIMENTS

The present disclosure is now described more fully with reference to the accompanying figures, in which several embodiments are shown. The present disclosure may be embodied or implemented in many different forms and should not be construed as limited to the embodiments set forth herein. Rather these embodiments are provided so that this disclosure will be thorough and complete and will fully convey the invention to those skilled in the art.

A. Overview

The present disclosure relates to simulating inductors wound on a ferromagnetic core as the magnetic material saturates. In one application, the present disclosure is advantageously used to model the asymmetric minor hysteresis loops commonly traversed by the output inductor of a switch mode power supply. An advantage of the subject matter of the disclosure is that it allows practical nonlinear inductors to be modeled in a computationally lightweight manner without conventional non-physical behavior under asymmetric minor hysteresis loop traversals. The disclosure is also conveniently applicable to practical ferromagnetic core materials because, in one particular implementation, the input parameters to the model are the core's coercive force (Hc), remnant magnetization flux density (Br), and saturation flux density (Bs).

Figure 2A:
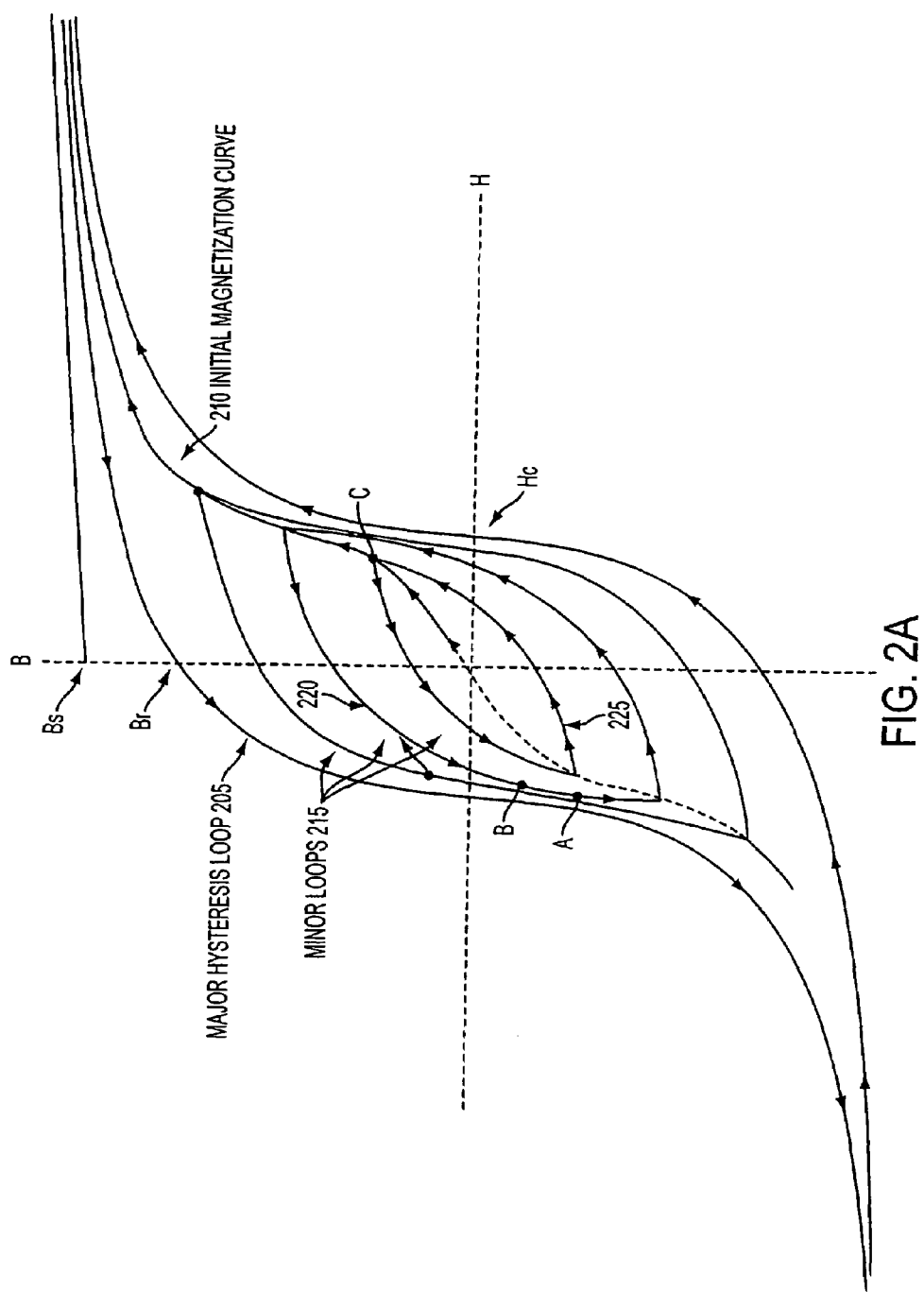
FIG. 2A is a graph illustrating a magnetic flux density (B)-magnetic field (H) curve showing the major hysteresis loop, the initial magnetization path, and some minor loops.

FIG. 2A illustrates a magnetic flux density (B)-magnetic field (H) curve showing the major hysteresis loop, the initial magnetization path, and some minor loops. By way of example, consider a case in which the upper branch of the minor loop 220 is being traversed in a direction of decreasing H. If the field reverses at point A, there is a symmetric minor loop 225 that can be extended out (past the initial magnetization curve) to meet the point of the turn at point A. At point C, the asymmetric path joins with and follows the initial magnetization curve. As is apparent, a discontinuity in slope results at point C. Although the discontinuity is non-physical, it does not cause a simulation problem.

On the other hand, if reversing at point B on minor loop 220, there is no symmetric minor loop that can be extended out to point B. In one implementation of the present disclosure, the asymmetric minor hysteresis loop is constructed as an affine map of a basis function, Bbasis(H), that matches the turning point B and the point of the minor symmetric hysteresis branch containing the turning point and the initial magnetization path.

Figure 1:
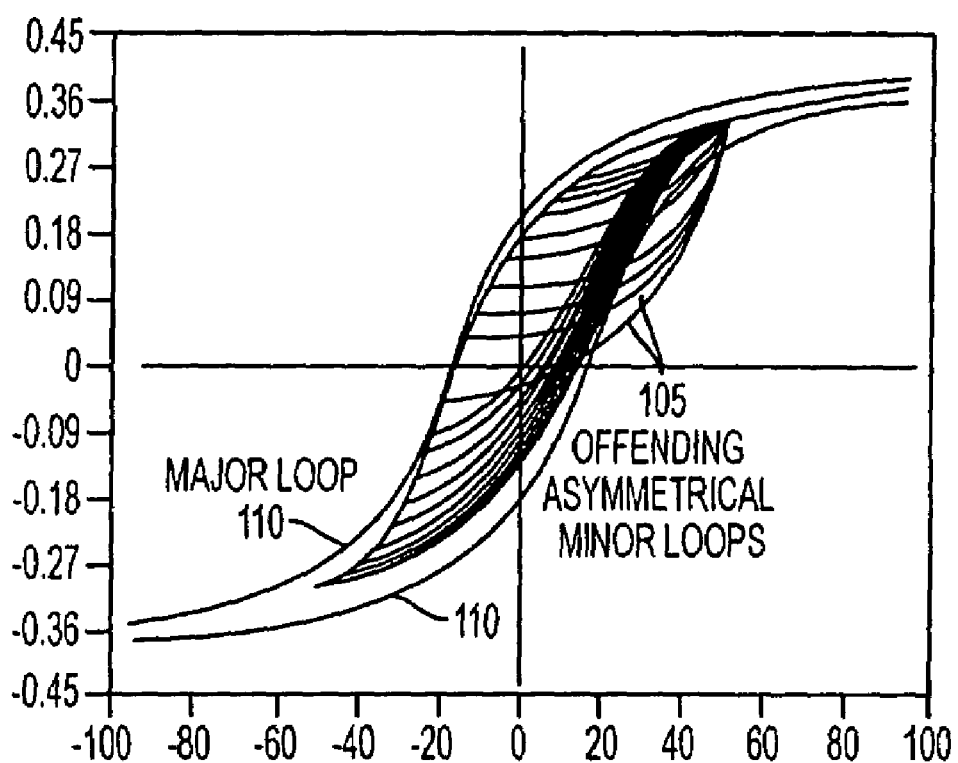
FIG. 1 is a graph illustrating a magnetic flux density (B) verses magnetic field (H) curve including asymmetric minor hysteresis loops in accordance with a prior art simulation. The vertical axis is magnetic flux density (B) and the horizontal axis is the magnetic field (H).
Figure 2B:
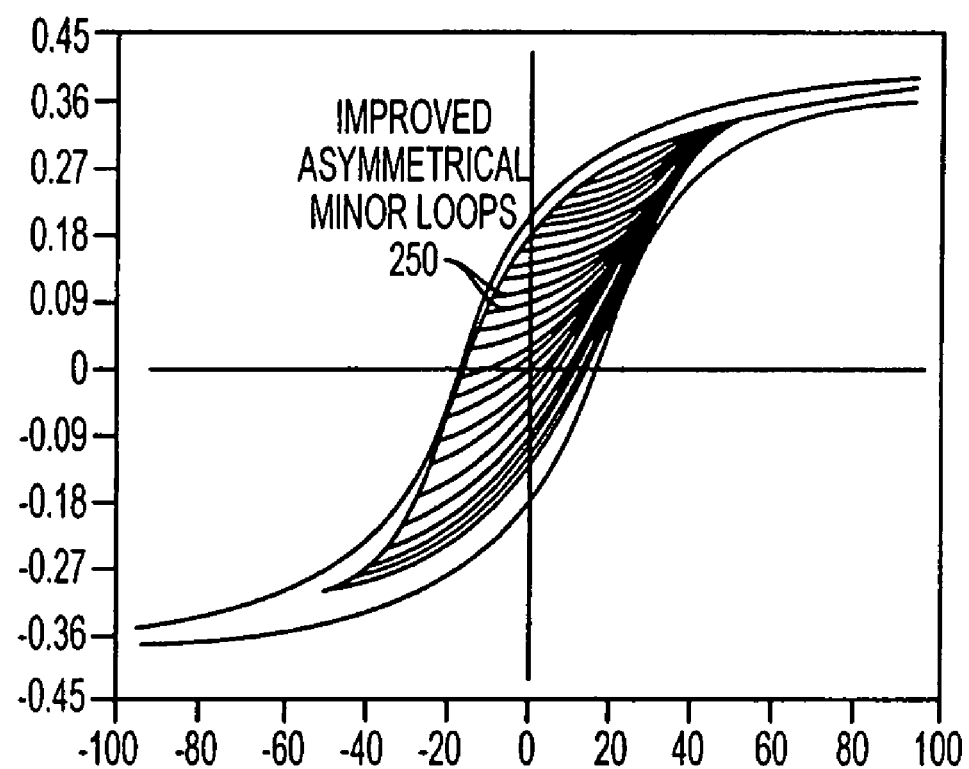
FIG. 2B is a graph illustrating a magnetic flux density (B) verses magnetic field (H) curve with asymmetrical minor hysteresis loops constructed using an affine map of a basis function. The vertical axis is magnetic flux density (B) and the horizontal axis is the magnetic field (H).

FIG. 2B is a graph illustrating a magnetic flux density (B)-magnetic field (H) curve with asymmetrical minor hysteresis loops 250 constructed using an affine map of a basis function. Additional implementation details for the affine map technique are described below with reference to FIG. 3. In contrast with the prior art technique shown in FIG. 1, the asymmetrical minor hysteresis loops 250 do not exhibit the non-physical behavior of extending beyond the bounds of the major hysteresis loops.

B. Method

Figure 3A:
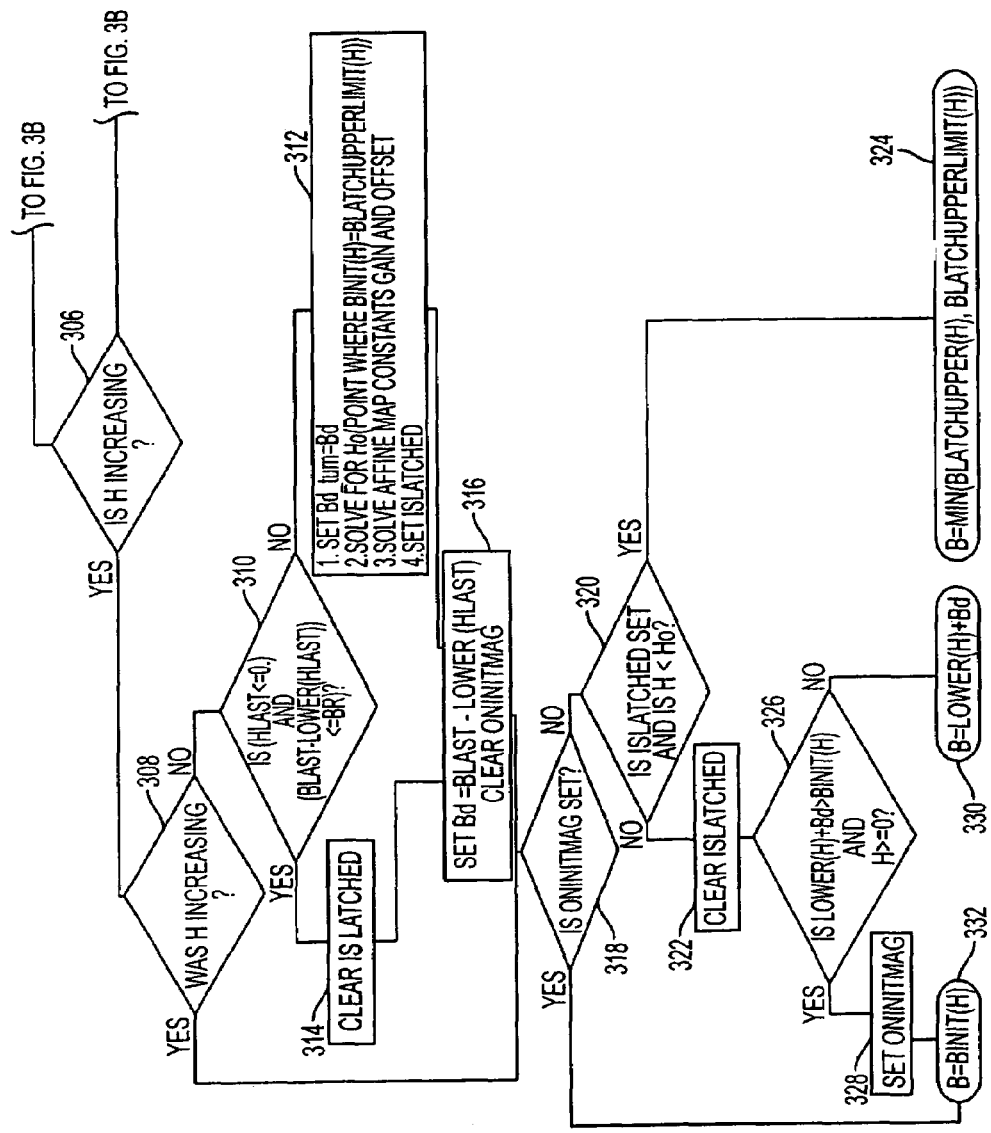
FIG. 3 is a flowchart illustrating a method for finding B(H) according to one implementation of the present disclosure.
Figure 3B:
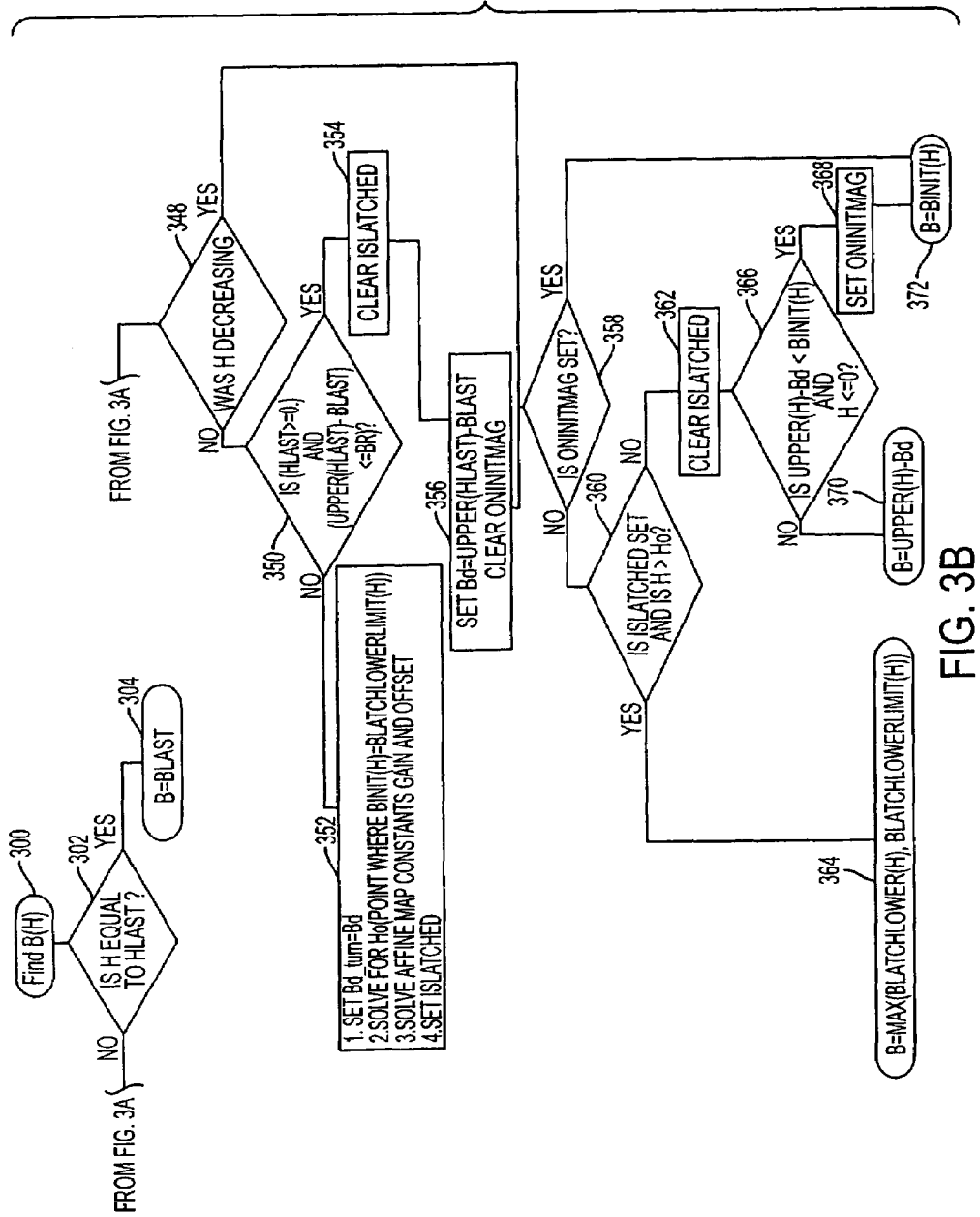

FIG. 3 is a flowchart illustrating a method for finding B(H) according to one implementation of the present disclosure. The following description refers to mathematical functions that are defined below in Table 1. The method begins by determining (step 302) whether H is equal to Hlast (the last value of H). If so, then the method receives (step 304) the last answer. If not, the method determines (step 306) if H is increasing. If H is increasing, then the method continues at step 308. If H is not increasing, then the method continues at step 348.

At step 308, the method considers whether H was increasing. If not, then a reversal or turn is to be considered from the last value of H. If H was increasing, the method determines (step 318) whether H is on the initial magnetization path (OnInitMag). If so, then B is assigned (step 332) the value of the Binit at point H (Binit(H)).

Returning to step 320, the method determines whether the IsLatched variable is set and whether the current value of H is before the point at which the affine transformation solution intersects the curve where it should follow the initial magnetization path (H<Ho). As one skilled in the art will appreciate, the IsLatched Boolean is set when the affine transformation solution is used to calculate the value of B. The affine transformation is described in further detail below and with reference to steps 312 and 352. At step 324, B is assigned the minimum of BlatchUpper(H) and BlatchUpperLimit(H) to implement the affine transformation solution. BlatchUpperLimit(H) is used to ensure that the affine map solution does not cross over the loop that it came from.

If IsLatched is not set or H>=Ho, the method clears the IsLatched Boolean variable at step 322 to ensure that it is cleared for the subsequent steps. The method determines (step 326) whether Lower(H)+Bd>Binit(H) and H>=0 and then the method notes that the current value of B is on the initial magnetization path by setting (step 328) the OnInitMag Boolean. Otherwise (if not on the initial magnetization path), then B is assigned 330 Lower(H)+Bd.

Returning to step 310, the method determines whether a symmetric minor loop can be extended to meet the turning point. If so, the method proceeds to step 314 to clear the IsLatched Boolean because an affine map solution is not needed in this case, compute (step 316) the value of Bd, and clear the OnInitMag Boolean variable.

If a symmetric minor loop cannot be extended to fit the turning point, then the method solves for the function to construct the asymmetric minor loop. In step 312, the method assigns Bd_turn to Bd at the point of the turn, solves for Ho (which is the point where Binit(H)=BlatchUpperLimit(H)), solves the affine map scale and offset constants, and sets the IsLatched Boolean. Specifically, the method performs an affine map of the minor loop with Bd=Br to the end points (Bd_turn and Ho) of the asymmetric minor loop. The method continues at step 316.

Returning to step 306, if H is not increasing, then control flows to step 348. It should be noted that steps 348-372 are complements to steps 308-332 described above. Furthermore, the implementation of the invention shown in FIG. 3 includes functions and variables that are defined below in Table 1. The functions in Table 1 are intended to be implemented or evaluated in C or C++ program code and include operators arranged as such. Of course, other programming languages may be used in a suitable computing device implementation.

TABLE 1

Functions used:

MIN(x, y) = x < y ? x : y
MAX(x, y) x > y ? x : y
Upper(H) = Bs * (H + Hc)/(|H + Hc| + Hc * (Bs/Br − 1)) + µ0 * H
Lower(H) = Bs * (H − Hc)/(|H − Hc| + Hc * (Bs/Br − 1)) + µ0 * H
Binit(H) = .5 * (Upper(H) + Lower(H))
UpperBmag(H) H < 0 ? Lower(H) + Br : Binit(H)
LowerBmag(H) H > 0 ? Upper(H) − Br : Binit(H)
BlatchUpper(H) = scale * UpperBmag(H) + offset
BlatchLower(H) = scale * LowerBmag(H) + offset
BlatchUpperLimit(H) = Upper(H) − Bd_turn
BlatchLowerLimit(H) = Lower(H) + Bd_turn Variables used:

Blast, Hlast, OnInitMag, IsLatched, Bd
Bd_turn, Ho, scale, offset
dir (Direction H used to be changing)

C. Circuit Simulation Example

Figure 4:
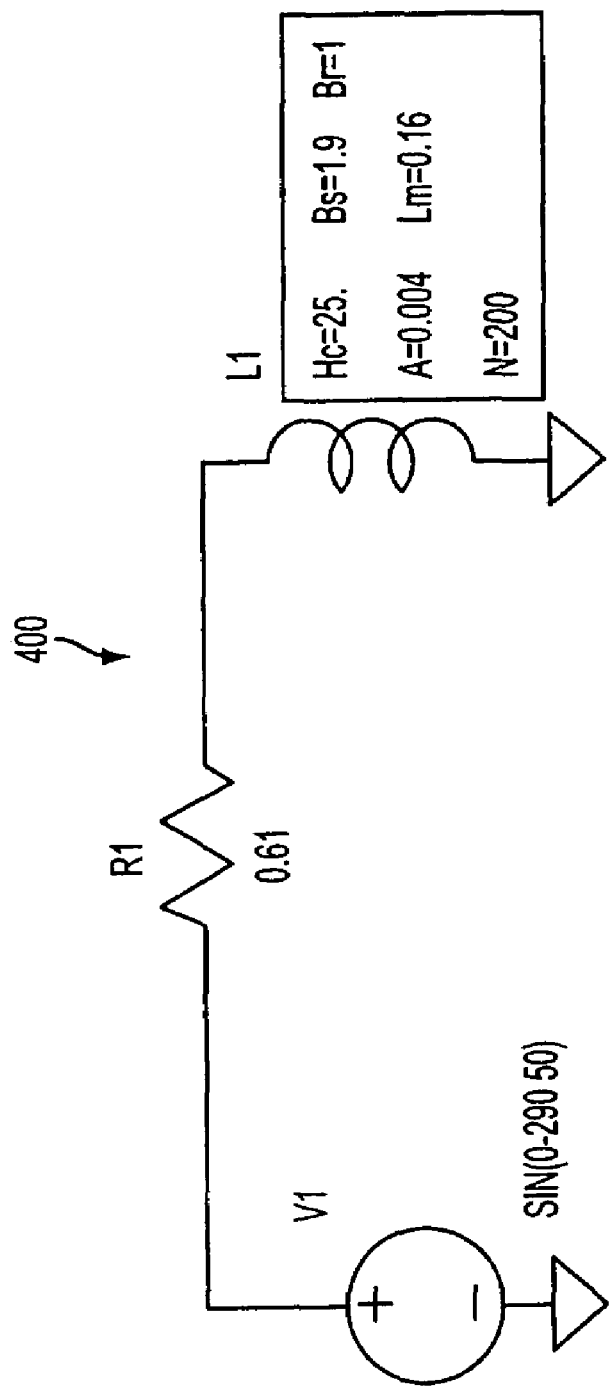
FIG. 4 is a schematic of an exemplary circuit including a voltage source, resistor, and inductor.

FIG. 4 is a schematic of an exemplary circuit 400 including a sine wave voltage source driving a series resistor and inductor. As one skilled in the art will recognize, the parameter notations in FIG. 4 (e.g., SIN(0-290 50)) are expressed in conventional Simulation Program with Integrated Circuit Emphasis (SPICE) or similar format. The inductor instance parameters, A, Lm, and N refer to the ferromagnetic core's cross-sectional area, magnetic path length and number of turns of current-bearing conductor about the core respectively.

Figure 5A:
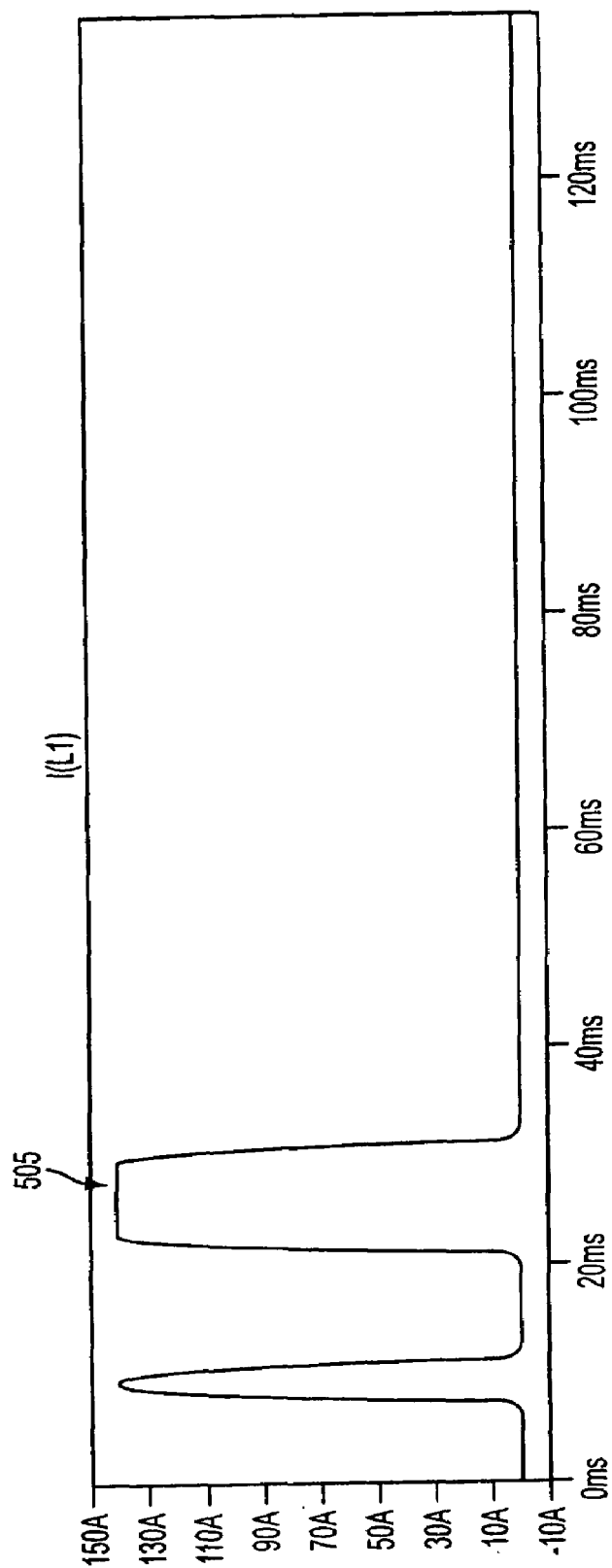
FIG. 5A is a waveform showing a simulation of inductor current for the circuit of FIG. 4 in accordance with the prior art.
Figure 5B:
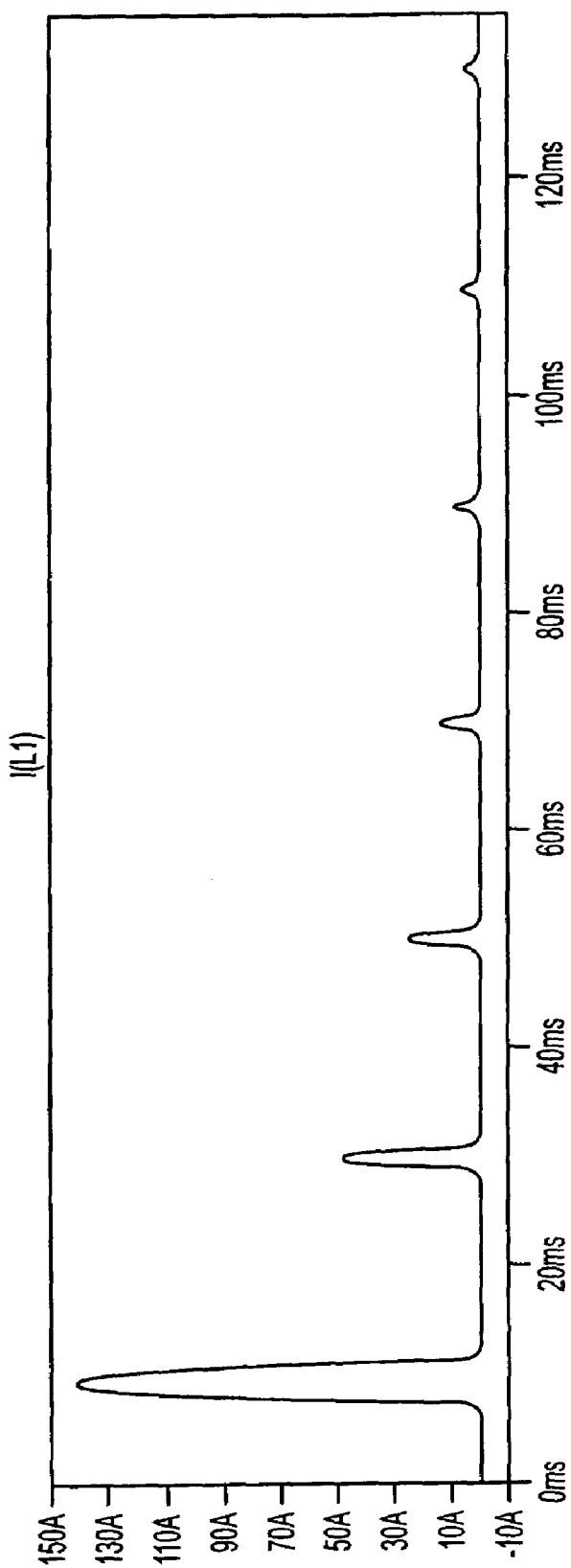
FIG. 5B is a waveform showing a simulation of inductor current for the circuit of FIG. 4 in accordance with one implementation of the present disclosure.
Figure 6:
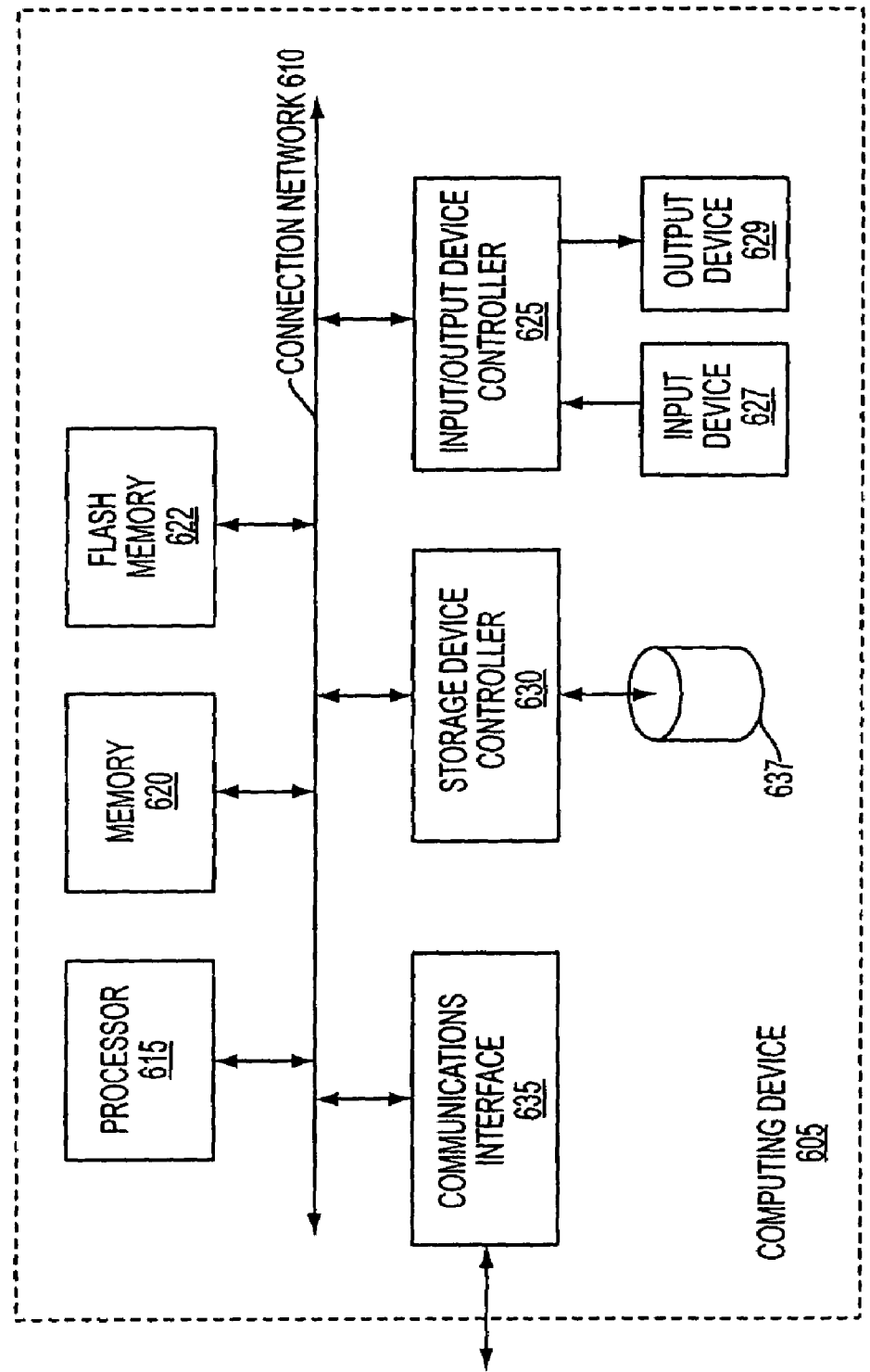
FIG. 6 is a block diagram of a computing device for implementing the method of FIG. 3.

FIGS. 5A and 5B show the operation of the circuit 400 according to a prior art circuit simulation technique and one implementation of the present disclosure, respectively. More specifically, FIG. 5A illustrates the inductor current when a prior art circuit simulation technique (e.g., the Chan technique described above) is used to simulate the circuit 400. As is apparent, high current corresponds to a saturated core. In the region identified as 505, the inductor behaves much more saturated than is appropriate for the first asymmetric hysteresis loops that the core traverses. As can be seen in FIG. 5B, when one implementation of the present disclosure is used to simulate the circuit 400, the inductor current does not exhibit the saturation problem shown in FIG. 5A. Accordingly, FIG. 5B illustrates a more accurate representation of the circuit behavior.

D. Computing Device

A computing device is generally an efficient way of implementing the features or functions disclosed herein, as one skilled in the art will recognize, however, other techniques such as lookup tables may be used in addition to or instead of the calculating, the determining, and/or the constructing generally performed in a computing device implementation.

In the illustrated embodiment, the computing device 605 includes a connection network 610, a processor 615, a memory 620, a flash memory 622, an input/output device controller 625, an input device 627, an output device 629, a storage device controller 630, and a communications interface 635. Also included is an internal storage device 637.

The connection network 610 operatively couples each of the processor 615, the memory 620, the flash memory 622, the input/output device controller 625, the storage device controller 630, and the communications interface 635. The connection network 610 can be an electrical bus, switch fabric, or other suitable interconnection system.

The processor 615 is a conventional microprocessor. Although the processor 615 is shown as a singular entity, multiple instances of microprocessors (i.e., a multiprocessor system) and/or multiple core microprocessors may be used. The processor 615 executes instructions or program code modules from the memory 620 or the flash memory 622. The operation of the computing device 605 is programmable and configured by the program code modules. Such instructions may be read into memory 620 or the flash memory 622 from a computer readable medium, such as a device coupled to the storage device controller 630.

Execution of the sequences of instructions contained in the memory 620 or the flash memory 622 cause the processor 615 to perform the method or functions described herein and with reference to FIG. 3. In alternative embodiments, hardwired circuitry or lookup tables may be used in place of or in combination with software instructions to implement aspects of the disclosure. Thus, embodiments of the disclosure are not limited to any specific combination of hardware circuitry and software. The memory 620 can be, for example, one or more conventional random access memory (RAM) devices. The flash memory 622 can be one or more conventional flash RAM, or electronically erasable programmable read only memory (EEPROM) devices. The memory 620 may also be used for storing temporary variables or other intermediate information during execution of instructions by processor 615.

The input/output device controller 625 provides an interface to the input device 627 and the output device 629. The output device 629 can be, for example, a conventional display screen. The display screen can include associated hardware, software, or other devices that are needed to generate a screen display. The illustrated embodiment also includes an input device 627 operatively coupled to the input/output device controller 625. The input device 627 can be, for example, an external or integrated keyboard or cursor control pad.

The storage device controller 630 can be used to interface the processor 615 to various memory or storage devices. In the illustrated embodiment, the internal storage device 637 is shown for storing software applications (e.g., a circuit simulator application), user data, system configuration, and the like. As one skilled in the art will appreciate, the internal storage device 637 can be any suitable storage medium, such as magnetic, optical, or electrical storage.

The communications interface 635 provides bidirectional data communication coupling for the computing device 605. The communications interface 635 can be functionally coupled to a local area or wide area network. In one embodiment, the communications interface 635 provides one or more input/output ports for receiving electrical, radio frequency, or optical signals and converts signals received on the port(s) to a format suitable for transmission on the connection network 610. The communications interface 635 can include a radio frequency modem and other logic associated with sending and receiving wireless or wireline communications. For example, the communications interface 635 can provide an Ethernet interface, Bluetooth, and/or 802.11 wireless capability for the computing device 605.

Having described embodiments of asymmetric minor hysteresis loop model and circuit simulator including the same (which are intended to be illustrative and not limiting), it is noted that modifications and variations can be made by persons skilled in the art in light of the above teachings. It is therefore to be understood that changes may be made in the particular embodiments disclosed that are within the scope and spirit of the present disclosure.

What is claimed is:

1. A computer-implemented method of modeling the ferromagnetic core of an inductor or transformer in a circuit simulator, the method comprising:

the computer obtaining upper and lower branch functions for the major hysteresis loop from memory;

obtaining an initial magnetization path as an average of the upper and lower branch functions;

determining using the computer, symmetric minor hysteresis loops as the upper and lower branch functions vertically translated by a constant for each specific symmetric minor hysteresis loop; and constructing using the computer, asymmetric minor hysteresis loops as an extension of a minor symmetric hysteresis loop when such a minor loop exists, otherwise a function bound between the branch of the minor hysteresis loop containing the turning point and a basis function composed of the initial magnetization path for one sign of H and the major loop translated by the remnant magnetization flux density for the other sign of H, using the constructed asymmetric minor hysteresis loops for circuit simulation of the inductor or transformer in the circuit simulator, and displaying a result of the circuit simulation.

2. The method of claim 1, wherein the function used to construct the asymmetric hysteresis loop for which there is no corresponding minor symmetric hysteresis loop is the affine map of the basis function, Bbasis(H), that matches the turning point and the point of the minor symmetric hysteresis branch containing the turning point and the initial magnetization path.

3. The method of claim 1, wherein the core is used with a gap.

4. A system for modeling the ferromagnetic core of an inductor or transformer in a circuit simulator, the system comprising:

a processor including program code instructions configured to implement steps of:

obtaining upper and lower branch functions for the major hysteresis loop;

obtaining an initial magnetization path as an average of the upper and lower branch functions;

determining symmetric minor hysteresis loops as the upper and lower branch functions vertically translated by a constant for each specific symmetric minor hysteresis loop; and constructing asymmetric minor hysteresis loops as an extension of a minor symmetric hysteresis loop when such a minor loop exists, otherwise a function bound between the branch of the minor hysteresis loop containing the turning point and a basis function composed of the initial magnetization path for one sign of H and the major loop translated by the remnant magnetization flux density for the other sign of H;

using the constructed asymmetric minor hysteresis loops for circuit simulation of the inductor or transformer in the circuit simulator; and displaying a result of the circuit simulation.

5. The system of claim 4, wherein the function used to construct the asymmetric hysteresis loop for which there is no corresponding minor symmetric hysteresis loop is the affine map of the basis function, Bbasis(H), that matches the turning point and the point of the minor symmetric hysteresis branch containing the turning point and the initial magnetization path.

6. The system of claim 4, wherein the core is used with a gap.

7. A computer readable storage medium encoded with a circuit simulation program, when executed by a computer, modeling the ferromagnetic core of an inductor or transformer in a circuit simulator, the simulation program comprising:

a first program code for obtaining upper and lower branch functions for the major hysteresis loop;

a second program code for obtaining an initial magnetization path as an average of the upper and lower branch functions;

a third program code for determining symmetric minor hysteresis loops as the upper and lower branch functions vertically translated by a constant for each specific symmetric minor hysteresis loop; and a fourth program code for constructing asymmetric minor hysteresis loops as an extension of a minor symmetric hysteresis loop when such a minor loop exists, otherwise a function bound between the branch of the minor hysteresis loop containing the turning point and a basis function composed of the initial magnetization path for one sign of H and the major loop translated by the remnant magnetization flux density for the other sign of H;

a fifth program code for using the constructed asymmetric minor hysteresis loops for circuit simulation of the inductor or transformer in the circuit simulator; and sixth program code for displaying a result of the circuit simulation.

8. The computer readable storage medium of claim 7, wherein the function used to construct the asymmetric hysteresis loop for which there is no corresponding minor symmetric hysteresis loop is the affine map of the basis function, Bbasis(H), that matches the turning point and the point of the minor symmetric hysteresis branch containing the turning point and the initial magnetization path.

9. The computer readable storage medium of claim 7, wherein the core is used with a gap.

* * * * *